United States Patent [19]

Van Stappen

[11] 4,254,210
[45] Mar. 3, 1981

[54] COMBINED SILVER HALIDE TONABLE PHOTOPOLYMER ELEMENT TO INCREASE DENSITY

[75] Inventor: Albert L. Van Stappen, Rumson, N.J.

[73] Assignee: E. I. Du Pont de Nemours and Company, Wilmington, Del.

[21] Appl. No.: 904,911

[22] Filed: May 11, 1978

Related U.S. Application Data

[63] Continuation of Ser. No. 743,316, Nov. 19, 1976, abandoned.

[51] Int. Cl.$^2$ .................. G03C 1/76; G03C 1/52; G03C 5/00; G03C 5/26
[52] U.S. Cl. .................. 430/285; 430/156; 430/270; 430/291; 430/357; 430/376; 430/394; 430/502; 430/503; 430/966; 430/967; 430/144

[58] Field of Search ............ 96/68, 75, 35.1, 27 E, 96/115; 430/156, 273, 502, 503, 966, 967, 394, 291, 144, 285

[56] References Cited

U.S. PATENT DOCUMENTS

| 3,313,626 | 4/1967 | Whitney | 96/115 |
| 3,380,831 | 4/1968 | Cohen | 96/35 |
| 3,649,268 | 3/1972 | Chu | 96/27 R |
| 3,778,270 | 12/1973 | Roos | 96/75 |

FOREIGN PATENT DOCUMENTS

| 1204496 | 9/1970 | United Kingdom | 96/68 |
| 1228591 | 4/1971 | United Kingdom | 96/75 |

Primary Examiner—Mary F. Downey

[57] ABSTRACT

To reduce silver coating weight in photographic silver halide elements (e.g., medical X-ray films) the density of the silver image is increased by forming a black-toned, direct positive image in a photopolymer layer on the reverse side from the silver image.

13 Claims, 4 Drawing Figures

- 2a — ANTIABRASION
- 2 — SILVER HALIDE EMULSION
- 3a — RESIN SUBSTRATE
- 3 — SUPPORT
- 3b — RESIN SUBSTRATE
- 4 — PHOTOPOLYMER
- 4a — PROTECTIVE SHEET

COMBINED SILVER HALIDE TONABLE PHOTOPOLYMER ELEMENT TO INCREASE DENSITY

This is a continuation of application Ser. No. 743,316, filed Nov. 19, 1976, now abandonment.

BACKGROUND OF THE INVENTION

It is generally known to combine silver halide emulsion layers with photopolymerizable layers to produce relief printing plates using a combination comprising a support, a photopolymerizable stratum, and a silver halide emulsion layer. To produce such plates the silver halide emulsion layer, which is many times more sensitive to radiation than the photopolymer layer, is exposed to a suitable transparency, for example, developed in a suitable developing solution, fixed, and dried. The photopolymerizable layer is then imaged using the resulting silver image as a mask; and after developing in aqueous alkali (which washes away both the silver halide emulsion layer remaining and the unexposed portions of the photopolymer layer), a suitable relief image remains, which is useful directly for printing. The art has not connected this technology to photography, probably because the removal of the silver halide emulsion layer from printing plates teaches away from silver halide photography.

SUMMARY OF THE INVENTION

This invention is directed to a photographic element combining a silver halide layer and a photopolymerizable layer, which will increase the top density of the silver image and at the same time will economize on the use of silver, which is the most expensive element in photographic film.

A transparent film support is coated on one side with a high speed, low coating weight, gelatino/silver halide emulsion, and on the back side with a positive-working photopolymerizable layer. The silver halide layer is exposed image-wise to actinic radiation, and the latent image is developed conventionally. This image is then used as a mask to expose the photopolymerizable layer to ultraviolet light, and the resulting latent image is developed by treatment with a pigment or toner. In this way the photopolymer image increases the contrast and density of the silver halide image; thus a reduction in silver is possible.

BRIEF DESCRIPTION OF THE DRAWINGS

Referring now to the drawings attached hereto,

FIG. 1 illustrates a film structure in which a transparent polyester film support 3 is coated topside with a resin substrate 3a, a silver halide emulsion layer 2, and an antiabrasion layer 2a, and on the back with a resin substrate 3b, photopolymerizable layer 4, and a protective cover sheet 4a. While not illustrated in FIG. 1, a gelatin substratum may optionally be interposed between the silver halide emulsion layer 2 and resin substrate 3a. For simplicity, FIGS. 2, 3 and 4 illustrate only elements 2, 3 and 4 of FIG. 1.

In FIG. 2 the silver halide emulsion layer 2 is exposed image-wise through a transparency 1 to form a latent image 5 therein.

In FIG. 3, the latent image 5 has been converted to a silver image 5 by conventional development and fixing and the photopolymerizable layer 4 is now exposed to UV light and becomes polymerized. The blackened silver image 5 prevents the passage of UV light and thus the corresponding areas 6 in the photopolymer layer remain unexposed and therefore unpolymerized.

FIG. 4 shows the finished product. The non-polymerized areas 6 have been treated with a developing agent (pigment or toner) which adheres thereto, forming an image 7 corresponding to the silver image 5 in layer 2. Thus, the Dmax and contrast of the silver image 5 are increased by combination with the toned image 7.

DETAILED DESCRIPTION OF THE INVENTION

Figure 1:
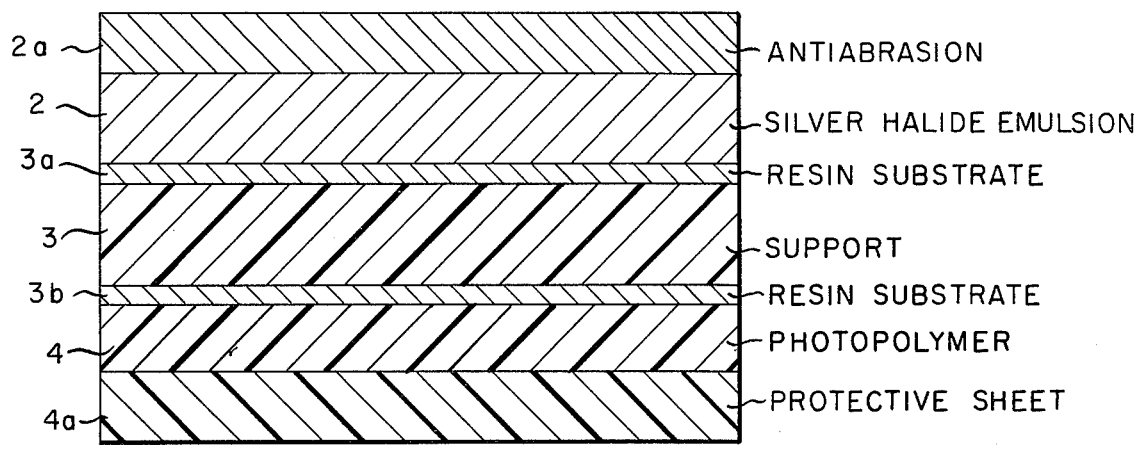
FIGS. 1, 2, 3 and 4 are cross-sections of the composite film of this invention, and they schematically illustrate its exposure and development.

The image-forming composite film element described herein has great utility as a medical X-ray film, where it is customary to coat the gelatino/silver halide emulsion on both sides of a transparent film support. With this invention, however, it is necessary to coat the silver halide emulsion only on one side of the film support.

Negative or positive working silver halide elements may be used in this invention equally well. We prefer to use a negative working high speed, gelatino/silver iodobromide emulsion comprising mainly AgBr with small amounts of AgI, although any photosensitive silver halide system (e.g. AgBr, AgCl, AgI or mixtures of halides) can be used.

The positive-working imaging element of this invention is a photopolymerizable layer which is usually tacky in the non-polymerized state. Exposure causes photoinitiated polymerization to take place in the areas struck by light; these harden and lose tackiness. The image is then developed by dusting the stratus with colorants or toners which adhere to the still tacky unexposed areas but not to the exposed or hardened areas.

Referring to FIGs. 1–4, preferably the two photosensitive layers 2, 4 are applied to the transparent film support 3 concurrently, forming a unitary, photosensitive film combination which is then exposed and processed as described. However, the photopolymerizable layer 4 may be applied to the support after the silver image has been developed, fixed and dried, since the aqueous processing fluids for the silver layer may diffuse into layer 4, causing problems. If, however, a suitable protective layer 4a (e.g. polyethylene film, etc.) is laminated onto layer 4 after the latter has been coated on film support 3, the two layers may be present during the entire process of use. Alternatively, free floating processing may be used. In this type of processing, the exposed silver halide emulsion layer 2 is transported on belts through shallow processing baths so that only the emulsion layer is immersed within the processing fluid.

In yet another embodiment, the photopolymerizable layer may be applied directly over the exposed and developed silver image. This embodiment is achieved by coating a special subbing layer over the processed silver image. The photopolymerizable layer is then exposed through the transparent support and imaged as described above. This embodiment is not preferred since the entire image bearing structure is on one side of the support and additional handling steps are necessary.

In a preferred embodiment, a high speed, gelatino/silver halide, medical X-ray emulsion (about 98 mole % AgBr and about 2 mole AgI, about 1–2$\mu$ in grain size), brought to its optimum sensitivity by digestion with gold and sulfur is coated on one side of a polyethylene terephthalate film support coated on both sides with a typical copolymer resin subbing layer as described in Alles, U.S. Pat. No. 2,779,684 at Example IV, specifically a 90:10:2 vinylidene chloride/methyl acrylate/itaconic acid copolymer. A thin substratum of gelatin is also coated on the resin substrate on one side of said film support. The silver halide is coated on the gelatin-substratum to a coating weight of about 35–55 mg. AgBr/dm$^2$. An antiabrasion layer of gelatin (about 10 mg. gel/dm$^2$) is then coated over the emulsion layer and dried. Subsequently, a photopolymer layer having an appropriate cover sheet is laminated to the resin-subbed side of the film support (the side opposite to the emulsion-bearing side).

Two fluorescent X-ray intensifying screens are placed in intimate contact with a sample of this film, one on each side of the element, using a typical X-ray cassette. This screen-film element is then given an exposure to X-rays in a maner known to those skilled in the art. For example, a human patient can be placed between the screen-film element and an X-ray source. The X-rays will penetrate parts of the body in various degrees so that contrast in exposure on the film is obtained. The exposure of the film results from the excitation of the fluorescent screen by X-radiation. Assuming that the screens fluoresce in the blue-green region of the visible spectrum the film should be sensitive to that wave length of emitted light.

Figure 2:
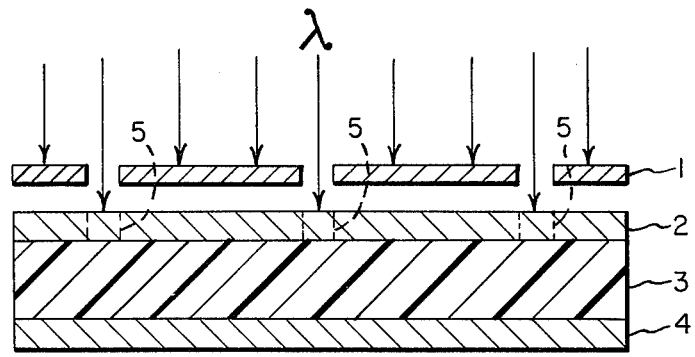
Figure 3:
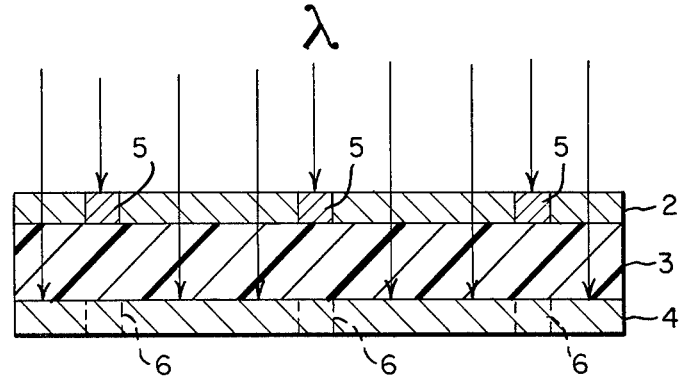
Figure 4:
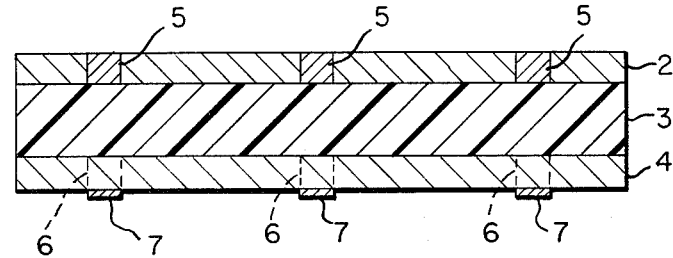

The film is then developed, fixed, washed and dried in the usual manner. The silver image formed in the silver halide layer is then used as a mask and the photopolymer layer is exposed through this mask to UV light, for example, as shown in FIG. 2. The exposed areas, those not covered by the silver image 5, are hardened and lose their tacky quality. The cover sheet 4a (FIG. 1) is then removed and a black pigmented toner is dusted on layer 4. The toner adheres only to the non-polymerized and tacky areas 6 yielding a black, toned image 7 identical to that formed in the silver halide layer. Thus, the contrast and Dmax of this composite film element is equivalent to one prepared from a double-side coated element (e.g. containing 90–150 mg. silver halide/dm$^2$). This represents a considerable savings of silver, with image quality improved over the same image produced in an all-silver halide system.

In order to modify the image somewhat, an additional layer of photopolymer may be laminated to the exposed and toned photopolymer layer and given an overall exposure to yield a glossy, hardened overcoat and protect the imaged areas.

Suitable transparent films useful as support 4 of this invention include the cellulosic supports, e.g. cellulose acetate, cellulose triacetate, cellulose mixed esters, etc,; polymerized vinyl compounds, e.g. copolymerized vinyl acetate and vinyl chloride; and, polystyrene and polymerized acrylates. The films formed from the polyesterification product of a dicarboxylic acid and a dihydric alcohol are particularly useful. Other suitable supports include polyethylene terephthalate/isophthalates of British Pat. Appln. No. 766,290 and Canadian Pat. No. 562,672 and those obtained by condensing terephthalic acid and dimethyl terephthalate with propylene glycol or cyclohexane 1,4-dimethanol (hexahydro-p-xylene alcohol). The films of Bauer et al., U.S. Pat. No. 3,052,543, may also be used. These films are modified polyesters containing a minor proportion of a recurring bivalent hydrocarbon unit having a metal sulfonate (M—SO$_3$—) substituent attached to a carbon atom of said unit. Polyethylene terephthelate films are particularly suitable because of their dimensional stability.

These transparent supports may also contain dyes and/or pigments incorporated therein in order to tint the support and modify the final image somewhat. For example, it is customary to include a blue dye within the support used for medical X-ray. This tinting may be accomplished without substantially altering the actinic light transmission of the support. Dyed antihalation underlayers or backings may be used during the exposure and handling of the silver halide emulsion as long as they are removed prior to exposure of the photopolymerizable element.

Photosensitive silver halide emulsion layer 2 can be any conventional silver halide emulsion comprising silver chloride, silver bromide, silver iodide, or mixtures of two or more halides. Conventionally, these are prepared by precipitation within a gelatin medium. In place of all or part of the gelatin other natural or synthetic colloids may be used including polyvinyl alcohol and its derivatives, e.g. partially hydrolyzed polyvinyl acetates, polyvinyl esters, and acetals containing a large number of extralinear-CH$_2$CHOH-groups; hydrolyzed interpolymers of vinyl acetate and unsaturated addition polymerizable compounds such as maleic anhydride, acrylic and methacrylic acid ethyl ester, and styrene. Further, these emulsions may contain quantities of water-insoluble latex particles, e.g. acrylic and methacrylic ester polymers and copolymers, butadiene/styrene copolymers, etc.

The gelatino/silver halide emulsions may also contain such agents as polyvinyl pyrrolidone, dextrin, dextran and/or other such agents which increase the covering powder of the developed silver. Particularly useful within the last group are the hydrolyzed, modified gelatins of Rakoczy, U.S. Pat. No. 3,778,278, formed by acid or base hydrolysis followed with, for example, reaction of the hydrolyzed product with dibasic anhydride. Emulsions containing these modified gelatins exhibit higher covering powder.

The silver halide emulsions may contain any of the well-known optical sensitizing dyes such as cyanines, carbocyanines, and merocyanines; non-optical sensitizers such as sulfur sensitizers containing labile sulfur, e.g. allyl isothiocyanate, allydiethylthiourea, and sodium thiosulfate; polyoxyalkylene ethers, and polyglycols. Antifoggants, wetting and coating aids, antistatic agents, hardeners and other adjuvants well-known to those skilled in the art may be added to these emulsions as well.

So-called color emulsions can also be used in single or multiple layers (e.g. with different color couplers in each layer). These emulsions contain silver halide plus a color-former. After exposure and conventional silver halide development, a color image is formed by developing in a color developer containing a color dye which reacts with the color coupler to form the desired colored image. The developed silver is then removed in a bleach bath and the film is then fixed, washed and dried. When a color emulsion is used in this element it may be desirable to apply a like color to the photopolymer image formed on the other side of the transparent support.

The silver halide emulsions can be coated on transparent support 3 to any desired thickness in any manner desired (e.g. using coating machines such as skim, airknife, bar, etc). A thin, protective stratum 2a of hardened gelatin may be coated on the emulsion layer if desired.

Among suitable photopolymerizable or photohardenable layers 4 to be coated on or laminated to the opposite side of the transparent film support 3 are: (1) those in which a photopolymerizable monomer is present alone or in combination with a compatible binder, or (2) those in which the photopolymerizable group is attached to a polymer backbone which becomes activated on exposure to light and may then cross-link by reacting with a similar group or other reactive sites on adjacent polymer chains. Thus, within this invention the terms "photopolymerizable" or "photohardenable" refer to systems in which the molecular weight of at least one component of the photosensitive layer is increased by exposure to actinic radiation sufficiently to result in a change in the rheological and thermal behavior of the exposed areas. Thus, any positive-working photopolymerizable system in which the exposed areas are partially or totally removed in some manner, and in which the remaining unexposed areas can be imaged in some way, will function within this invention.

The element and process described in Chu et al. U.S. Pat. No. 3,649,268 are particularly useful within this invention. The photopolymer elements described in this patent include the free radical-initiated, chain propagating, addition polymerization, ethylenically unsaturated compounds described in Burg et al. U.S. Pat. No. 3,060,023; Celeste et al. U.S. Pat. No. 3,261,686; and Cohen et al. U.S. Pat. No. 3,380,831 and include, for example, triethylene glycol dimethacrylate, and trimethylolpropanetrimethacrylate, among others. Exposure raises the stick temperature of those areas receiving radiation and a powdered colorant material, when applied to the surface, then adheres only to the unexposed areas, revealing a suitable colored image.

This invention is not limited, however, to these elements. Other nonsilver halide positive-working photosensitive materials may also be used as photopolymerizable layer 4. For example, the bis-diazonium salt compositions of Roos, U.S. Pat. No. 3,788,270 may be coated in place of the photohardenable or photopolymerizable elements described above. These are cross-linkable compositions comprising a bis-diazonium salt with a natural or synthetic macromolecular organic polymer having pendant reactive groups (e.g. gelatin, glue, polymeric polyols, etc.). In these compositions the areas struck by light become desensitized and do not cross-link when treated with basic fumes or solutions. Thus, these areas may then be washed out leaving only the unexposed areas behind. If a suitable colorant is included within the composition the areas remaining after wash-out are colored.

In the preferred element containing the preferred photopolymerizable layer described above, we prefer to use the colorants described in Chu et al. U.S. Pat. No. 3,620,726, Nov. 16, 1971. These colorants have a size distribution with the range of 0.2 to 30 microns and not more than 50% of the particles are less than 1 micron equivalent spherical diameter. These colorants are applied according to the teachings of that patent and adhere to the tacky, unexposed areas yielding an image similar to that formed in the silver halide layer on the other side of the transparent film support. Since a wide variety of colorants are available, any color in the silver layer can be easily matched with the colorants of Chu et al. Since this last step is dry, extreme utility is achieved and densities as high as 3.0–3.5 are obtainable.

After the colorant or toner has been applied and the excess removed it is preferable to apply an overcoat of the same photopolymer. This is then given an overall exposure to form a hardened, protective overcoat for the image. This overcoat may contain additives to impart varying degrees of matte finish to the image. If no matte additives are incorporated thereon, the finished image will appear glossy. In any case, the image within the photopolymer layer can be made to match the image in the silver-bearing layer exactly.

The photopolymerizable layer 4 may be applied to the element by any well-known process such as doctor blade coating from solution, or lamination from another element.

This invention will now be illustrated by the following specific examples:

EXAMPLE 1

In this example, the film support was 0.0076 in. (0.0193 cm.) thick conventionally prepared polyethylene terephthalate additionally containing a blue dye to tint the support. The support was coated on both sides with a resin subbing layer of vinylidene chloride/alkyl acrylate/itaconic acid copolymer mixed with an alkyl acrylate and/or methacrylate polymer. On one side, the resin sub was overcoated with a thin anchoring substratum of gelatin (about 0.5 mg./dm$^2$). On the side of the support containing both the resin and the gelatin subs a silver halide emulsion was applied at a coating weight of about 30 mg. silver halide/dm$^2$. This material was prepared from an aqueous gelatin/ethyl acrylate silver bromochloride emulsion containing about 30 mole percent AgBr and about 70 mole percent AgCl. (Small amounts of AgI may also be present.) The emulsion was brought to its optimum sensitivity with gold and sulfur, as taught in the art, and coating aids, antifoggants and hardeners were added just prior to coating on the support. Next, a photopolymer composition similar to U.S. Pat. No. 3,649,268, EX-1 comprising triethylene glycol dimethacrylate monomer, methylmethacrylate binder, and 2-o-chlorophenyl-4,5-bis-imadazoyldine-(m-methoxphenyl) initiator coated on a support sheet was laminated to the opposite side of the film support (resin subbed side only). The combined element was thus similar to FIG. 1. For control purposes, a sample without the photopolymer layer applied thereto was also prepared. A thin, hardened, gelatin antiabrasion layer was also coated over each gelatino/silver halide emulsion layer. In both samples, the silver halide emulsion layers were given a 20 second exposure through $\sqrt{2}$ step wedge to a tungsten source at the same distance. Both of the exposed strips were then developed by passage through an automatic processor, the details of which are not part of this invention, and nothing further was done with the control.

The photopolymer layer of the sample representing this invention was then given a 1½ minute exposure through the silver halide layer using the developed silver as a mask. The areas under the blackened silver image was not exposed and remained tacky while the exposed areas polymerized and lost their tackiness. After exposure, the cover sheet was stripped from the photopolymer and the image was recorded by applying thereon a conventional black toner. The toner adhered only to the unexposed, tacky portion revealing an image identical to the silver halide image already existing on the opposite side of the film support. The following sensitometric results were obtained:

| Sample | Base +Fog | Relative Speed | Gradient | $D_{Max.}$ |
|---|---|---|---|---|
| Control | 0.15 | 100 | 2.4 | 1.8 |
| This Invention | 0.15 | 93 | >5.0 | 3.3 |

The great advantage of this invention can easily be seen from this example. The gradient and $D$max of this element is equivalent to one with a silver halide coating weight 4 times greater. Thus, expensive silver was replaced with a much cheaper photopolymer at no loss in sensitometry.

EXAMPLE 2

A medical X-ray emulsion similar to that described in Van Stappen, U.S. Pat. No. 3,912,933 (gelatino silver iodobromide emulsion with a mean grain size of about 1.0 micron) was applied to a film support (same as Example 1) at a coating weight of about 45 mg. silver halide/dm$^2$. An antiabrasion gelatin layer (about 10 mg. gel/dm$^2$) was coated over said emulsion layer and the element then dried. A sample of this coating was then placed in a cassette along with two high speed medical X-ray fluorescent screens (one on either side of the film support). A metal $\sqrt{2}$ step wedge was placed on the cassette and the cassette exposed to an X-ray source for 1 second. For control, a double side coated (about 90 mg. silver halide/dm$^2$ per side) high speed medical X-ray film element (in a cassette with 2 fluorescent screens) was exposed in the same manner.

Both film elements were developed in an automatic processor as in Example 1. The photopolymer layer described in Example 1 was laminated to the exposed and developed sample of this invention on the resin-subbed side (opposite to the exposed and developed silver halide layer). This element was given a 1½ minute exposure as in Example 1, the cover sheet was removed and the image in the photopolymer layer developed by dusting with the same black toner. An additional layer of photopolymer was then laminated over the toned image and hardened by exposure to UV light. Thus the final image had a gloss appearance on both sides of the support. The speed, fog and gradient of this sample were equivalent to the high speed, double coated medical X-ray control. Of course, the sample from this invention had only about ¼th the silver halide coating weight which is a great reduction in the use of costly silver.

EXAMPLE 3

A gelatino, mono-dispersed grain, silver chlorobromide emulsion was prepared so that the ratio of AgCl to AgBr was about 70:30. This emulsion was brought to its optimum sensitivity with sulfur and gold as well known to those skilled in the art. Additionally, the emulsion also contained a blue sensitizing dye to extend the natural blue sensitivity out to about 515 m$\mu$. This material was coated on a sample of the same film base as that described in Example 1, coating the emulsion on the resin-gel sub side only. The coating weight was 37 mg. silver halide/dm$^2$. A gelatin abrasion layer was coated on the emulsion surface, and the film was then dried.

This sample was placed in a cassette along with a single fluorescent X-ray screen, the latter being placed with the fluorescent layer adjacent to the emulsion and the cassette placed facing an X-ray source at a distance of about 40 inches (101.6 cm.). The step wedge from Example 1 was placed between the X-ray source and the cassette and the sample was given a 2 minute exposure at 5 ma and 200 kVp. For control, a double side coated (about 150 mg. silver halide/dm$^2$ per side) industrial X-ray film, without fluorescent screens, was exposed in the same manner. The film of this invention, however, because of the low coating weight, could be rapid processed in 90 seconds while the control required 2½ minutes.

A photopolymer element (the same as that described in Example 1) was then laminated to the resin-subbed side of the film of this invention, given a 5-6 min. exposure, and toned as described therein. The resulting image was sharp and clean and the speed, contrast and density of the two films were identical. However, the silver halide coating weight of the film of this invention was only about 25% of the industrial X-ray film, and its image was sharper than that of the industrial X-ray film.

EXAMPLE 4

A lithographic silver chlorobromide emulsion dispersed in a gelatino-alkyl acrylate latex binder was prepared and brought to its optimum sensitivity with gold and sulfur. Additionally, the emulsion was sensitized out to about 520 m$\mu$ with an orthochromatic sensitizing dye. This emulsion was coated at about 35 mg. silver halide/dm$^2$ on a clear polyethylene terephthalate film base coated with a resin sub on both sides. One side was additionally coated with a layer containing an antihalation dye dispersed thereon and it was on this side that the emulsion layer was coated. This layer was designed to be non-diffusible yet dischargeable in the processing fluids so as to have no residual stain under the resulting image. A gelatin protective topcoat was placed on the emulsion layer and the element dried.

A sample from this coating was given a 10 second exposure through $\sqrt{2}$ step wedge and a magenta half-tone screen to a pulsed xenon light source and was machine processed in a standard hydroquinone-sodium formaldehyde bisulfite lithographic developer. After fixing, washing, and drying, a photopolymer layer identical to that described in Example 1 was laminated to the resin-subbed side, exposed, toned and overcoated as described in Example 1. The speed, contrast and top density of this element was equivalent to a standard litho film containing about three times as much silver halide emulsion.

EXAMPLE 5

The emulsion of Example 3 was coated on a polyethylene terephthalate support having the antihalation layer coated on the opposite side of said support. The gelatin topcoat was replaced however, with a topcoat comprised of a mixture of acrylate resins. After exposure and development as described in Example 3, the photopolymer layer of Example 1 was laminated on this acrylate resin layer, exposed through the support layer and developed by toning with the black toner described in Example 1. The product thus produced had equivalent speed, contrast and top density to an all-silver element (3 times the silver halide coating weight) and yielded excellent dot quality.

EXAMPLE 6

In order to demonstrate the utility of this invention with other polymer systems, a black diazo positive working element furnished by the 3M Company, St. Paul, Minn. ("Color-Key") was laminated in place of the photopolymer element of Example 1. The "Color-Key" layer (a high definition black transparency) was imaged by UV exposure through the silver image on the other side of the support and developed and fixed in the solutions furnished with this product. Directions for use are given with the element and these were followed in this example. The finished product was a high contrast, high density, high speed element with contrast and Dmax equivalent to an all-silver element having more than twice the silver halide coating weight.

EXAMPLE 7

A sample of Medichrome ® X-ray Film (double-side coated silver halide element furnished by Agfa Gevaert GmBH) was given a screen X-ray exposure as described in Example 2 and then developed in the developer furnished for this product. This developer contains a cyan coupling agent therein. A negative image of low contrast and density resulted from the coupling with the cyan dye incorporated within the emulsion. A photopolymer element identical to that described in Example 1 was then held in intimate contact with this image in a vacuum frame and exposed as described therein. The cover sheet was then stripped from the image photopolymer and the image developed by dusting with a cyan toner. When the photopolymer image was held in registry with the silver-dye image a higher contrast and density was achieved. This product simulated that which could have been achieved had the two separate elements been laminated together following the procedure described in Example 5.

EXAMPLE 8

A direct positive gelatino/silver chlorobromide emulsion made according to the teachings of Bigelow, U.S. Pat. No. 3,627,392 was prepared. This material contains $RhCl_3$ and is chemically fogged with a substituted thiaborone. Suitable wetting agents were then added and this material was coated on a photographic film support at about 700 mg. $AgNO_3/ft^2$. Two sample strips of this material were exposed through a $\sqrt{2}$ step wedge as described in Example 1. The exposed samples were then developed for about 1½ min. at 68° F. in the developer of Example 2, immersed in acid shortstop bath, fixed 3 minutes in a conventional fixer, washed and dried. A direct positive image resulted. One strip was kept as a control. On the reverse side of the other strip a photopolymer element identical to that described in Example 1 was laminated. This element was exposed to UV light through the direct positive silver halide image. The image was developed by toning as described in Example 1. An image with a Dmax of 4.36 vs. a Dmax of 2.94 in the control was obtained. This image also had a much higher contrast. Thus it is possible to use the concept of this inention with a positive working silver halide element.

In a manner like it would be possible to produce other color images using the proper color-coupling developer/emulsion combination and color toner for the photopolymer image. It has thus been shown that it is possible to modulate and improve the silver halide image by using a tonable photopolymer layer in conjunction therewith. By suitably modifying the system (e.g. providing a tough, protective layer on the photopolymer) it is possible to have both photosensitive layers present at all times. One would only have to protect the photopolymer layer from damage during the silver halide processing.

I claim:
1. An image-forming composite film comprising:
    (a) a support,
    (b) a layer of radiation-sensitive gelatino/silver halide emulsion on one side of said support, said emulsion having been brought to its optimum sensitivity with gold and sulfur, and
    (c) a positive-working photopolymerizable image-forming layer on the opposite side of said support and adapted to be exposed by light directed through the silver halide layer after the latter has been exposed and developed to form a blackened silver image; the photopolymerizable layer having the property of being tacky in the un-polymerized condition but becoming nontacky when polymerized.
2. The composite element of claim 1 wherein layer (c) is photohardenable and tonable.
3. The composite element of claim 1 wherein layer (c) is a photopolymerizable composition comprising triethylene glycol dimethacrylate monomer, methyl methacrylate polymer binder, and 2-o-chlorophenyl-4,5-bis-imidazoyldine-(m-methoxyphenyl) initiator.
4. The composite element of claim 1 wherein layer (b) is a negative-working silver halide emulsion.
5. The composite element of claim 1 wherein layer (b) is a positive-working silver halide emulsion.
6. The composite element of claim 1 wherein layer (c) is polyoxyethyl trimethylolpropane triacrylate.
7. The composite element of claim 1 wherein layer (c) is polyoxyethyl pentaerythritol triacrylate.
8. The composite element of claim 1 wherein a resin sub-coating is interposed between support (a) and silver halide emulsion layer (b).
9. A process of preparing a photograph which consists essentially of:
    (a) exposing a film comprising a transparent base carrying a gelatino/silver halide emulsion on one side, and a tacky positive-working photopolymerizable image-forming layer on the reverse side, whereby only the silver halide layer is exposed,
    (b) developing the latent image in the silver halide layer to form a silver image,
    (c) exposing the photopolymerizable layer through the silver image with ultraviolet radiation, whereupon the exposed areas become photopolymerized and non-tacky, while those areas which are unexposed because they are shaded by the silver image remain unpolymerized and tacky, and
    (d) developing the unexposed areas by applying a pigment or toner which adheres thereto but does not adhere to the photopolymerized areas, whereby the resulting pigmented or toned image increases the depth of the silver image.
10. The process of claim 9 wherein in step (a) the film is exposed to actinic radiation between two X-ray screens.
11. The process of claim 9 wherein the gelatino-silver halide emulsion contains a color coupler, and is developed in a solution containing a color coupler, to form a colored image.
12. A process of claim 11 wherein the photopolymerizable layer is given ultraviolet exposure through the colored silver image, whereby the exposed areas become photopolymerized but the unexposed areas do not, and the latter areas are selectively toned with a colored toner.

13. A process of preparing a photograph which consists essentially of:
(a) exposing a film comprising a transparent base carrying a gelatino/silver halide emulsion on one side,
(b) developing the latent image in the silver halide layer to form a silver image,
(c) laminating a tacky positive-working photopolymerizable image-forming layer to the reverse side of the support after the silver image has been developed and fixed,
(d) exposing the photopolymerizable layer through the silver image with ultraviolet radiation, whereupon the exposed areas become photopolymerized and non-tacky, while those areas which are unexposed because they are shaded by the silver image remain unpolymerized and tacky, and
(e) developing the unexposed areas by applying a pigment or toner which adheres thereto but does not adhere to the photopolymerized areas, whereby the resulting pigmented or toned image increases the depth of the silver image.

* * * * *